United States Patent [19]

Kikuchi et al.

[11] Patent Number: 4,823,278

[45] Date of Patent: Apr. 18, 1989

[54] METHOD OF LOGIC DESIGN OF INTEGRATED CIRCUIT

[75] Inventors: Hideo Kikuchi, Yokohama; Sadao Tsutsumi, Kawasaki; Akira Kaneko, Yokohama, all of Japan

[73] Assignee: Fujitsu Limited, Osaki, Japan

[21] Appl. No.: 154,452

[22] Filed: Feb. 8, 1988

Related U.S. Application Data

[63] Continuation of Ser. No. 758,466, Jul. 24, 1985, abandoned.

[30] Foreign Application Priority Data

Jul. 25, 1984 [JP] Japan ................................. 59-154665

[51] Int. Cl.$^4$ ............................................ G06F 15/60
[52] U.S. Cl. ..................................... 364/491; 364/490
[58] Field of Search ................. 364/488, 489, 490, 491

[56] References Cited

U.S. PATENT DOCUMENTS

| | | | |
|---|---|---|---|
| 4,612,618 | 9/1986 | Pryor et al. | 364/490 |
| 4,615,011 | 9/1986 | Linsker | 364/491 |

FOREIGN PATENT DOCUMENTS

| | | | |
|---|---|---|---|
| 60-79471 | 5/1985 | Japan | 364/491 |
| 2131577 | 6/1984 | United Kingdom | 364/489 |
| 2149537 | 6/1985 | United Kingdom | 364/489 |

OTHER PUBLICATIONS

K. C. Saraswat et al., "Effect of Scaling of Interconnections on the Tim Delay of VLSI Circuits", IEEE Journal of Solid-State Circuits, vol. SC-17, No. 2, Apr. 1982, pp. 275-280.

R. Perry et al., "Logic Design Software Casts Workstations in Role of Manufacturer's Aide", Electronic Design, vol. 32, No. 11, May 31, 1984, pp. 267-273.

D. G. Fairbairn, "VLSI: A New Frontier for Systems Designers", Computer, vol. 15, No. 1, Jan. 1982, pp. 87-96.

L. Smith, "Hierarchical Design Structures Simplify System Development", E.D.N. Electrical Design News, vol. 28, No. 19, Sep. 15, 1983, pp. 165-172.

Primary Examiner—Felix D. Gruber
Attorney, Agent, or Firm—Staas & Halsey

[57] ABSTRACT

A method for logic design of an integrated circuit IC in which at least one parameter concerning wiring line capacitances is used. The parameter can be precisely estimated even at a logic design stage preceding a layout design stage. The estimation is carried out by, first, classifying the logic units or the logic gates of the IC into hierarchal functional blocks. Second, specifying, for each closed network defined by delay paths, a higher level functional block in which the closed network is contained. Third, specifying lower level functional blocks enclosed by the higher functional block. Fourth, calculating the estimated wiring line capacitances of the closed network in accordance with predetermined data concerning both fan-out and actual wiring line capacitances. The data, used for the estimation, are varied in accordance with the degrees of the hierarchal level.

12 Claims, 8 Drawing Sheets

METHOD OF LOGIC DESIGN OF INTEGRATED CIRCUIT

This is a continuation of application Ser. No. 758,466 filed on July 24, 1985, now abandoned.

BACKGROUND OF THE INVENTION

1. Field of the Invention

The present invention relates generally to a method for logic design of an integrated circuit (IC), more particularly, to a method for estimating the wiring line capacitances on a single chip IC.

2. Description of the Related Art

In fabrication of a logic IC such as a microprocessor, the logic design comes first, followed by the layout design based thereon. In the logic design, the working relationship between the parts of a system is analyzed in detail in terms of the symbolic logic without primary regard for hardware, for example, distribution of wiring lines.

In recent years, logic IC's have been put into practical use in a variety of fields, such as signal processing, electronic control in automobiles, electronically controlled toys, and digital watches, due to the increasingly greater capabilities of logic IC's. For example, so-called custom large-scale integrated circuits (LSI's), such as LSI's manufactured under a building block method and gate array LSI's manufactured under a masterslice method, are being widely marketed. Competition, of course, demands that any new logic IC product be marketed as speedily as possible. This is particularly true with custom LSI's.

In the logic design of logic IC products, it is important to know the lengths of the wiring lines distributed on the related single chip IC. This is because each wiring line necessarily has its own capacitance, i.e., wiring line capacitance, which is, in general, substantially proportional to the length thereof. The wiring line capacitance is a major factor affecting the operation speed of the logic circuit, since it also acts as a load, i.e., load capacitance, for logic circuit driver elements. Accordingly, it is preferable that the lengths of the wiring lines be measured with a high degree of accuracy at the logic design stage to enable the best logic design. As commonly known, the load capacitance, i.e., the length of a wiring line, causes a signal delay—one of the most important parameters when arranging logic gates during the logic design of an IC.

However, it is impossible to measure the length of each wiring line accurately in the logic design stage, because the actual lengths of the wiring lines cannot be correctly determined until the layout design of the logic IC is completed. Thus, it is only possible to estimate the lengths of the wiring lines during the logic design stage. Such estimation is relatively easy for small scale IC's, but is not so easy for large-scale IC's.

Prior art methods of estimation were only able to estimate lengths to inch units and even this was difficult, as clarified hereinafter. Therefore, the lengths of the wiring lines could not be gauged with a high accuracy. This often made reevaluation of the logic design necessary after a trial layout design, thus increasing the time for producing the IC products.

SUMMARY OF THE INVENTION

It is an object of the present invention to provide a method for logic design of an IC, which can realize a better logic design than in the prior art. Specifically, it is an object of the present invention to estimate wiring line capacitances during the logic design stage, more accurately than possible in the prior art.

The above object is attained by a method including the steps of classifying each of many logic gates into one of two or more hierarchal functional blocks; specifying to which functional block each closed network of the wiring lines pertains; defining wiring line capacitances in accordance with both the level of the functional block and the number of subfunctional blocks; and counting the cumulative value of all the defined wiring line capacitances to determine a total wiring line capacitance of the concerned closed network.

BRIEF DESCRIPTION OF THE DRAWINGS

The present invention will be more apparent from the ensuing description with reference to the accompanying drawings, wherein.

DESCRIPTION OF THE PREFERRED EMBODIMENTS

Figure 1:
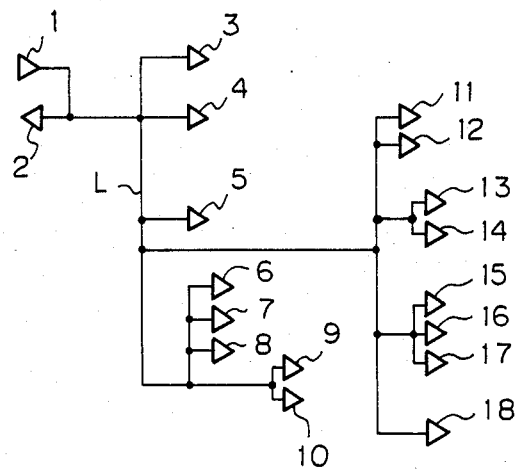
FIG. 1 is logic circuit diagram used for explaining a prior art method for estimating the wiring line capacitance.

Before describing the preferred embodiments, the prior art and the problems therein will be described in more detail with reference to the related figures. FIG. 1 is a logic circuit diagram used for explaining a prior art method for estimating wiring line capacitance. In FIG. 1, reference character L represents a wiring line. Wiring lines L are interconnected from one logic unit to another logic unit. There are, in this figure, 18 logic units, which are referenced with numerals 1 through 18. In this figure, the logic unit 1 functions as a driver unit and carries a load capacitance defined by the wiring lines L. Incidentally, each of the logic units 1 through 18 is usually fabricated with logic gates having a total equivalent gate number of about 1500.

As known, the characteristic operation speed of a logic gate driver element is mainly determined by its load capacitance. Specifically, the operation speed of the logic unit 1, i.e., the driver unit, is defined by the load capacitances. The load capacitances are defined by two different capacitances $C_1$ and $C_2$. The load capacitance $C_1$ is derived from the total capacitance of the logic units 2 through 18. The other capacitance $C_2$ is derived from the total capacitance of the wiring lines L.

At the logic design stage, the load capacitance $C_1$ can be correctly determined, however, the load capacitance $C_2$ cannot. The former load capacitance can be determined because logic units (relating to $C_1$) are not changed in structure at the layout design stage. In the latter case, however, the arrangement of the wiring lines (relating to $C_2$) cannot necessarily be maintained at the layout design stage. It may be greatly changed in accordance with the layout design as a great number of wiring lines are accommodated on a single IC chip. This makes it very difficult to correctly estimate the load capacitance $C_2$, i.e., the length of the wiring lines, at the logic design stage.

In a prior art method for estimating the wiring line capacitance, an initial estimation of the capacitance $C_2$ is made using a function of a number n, n being equal to the fan-out. This is based on the fact that the wiring line capacitance is proportional to the number of logic units. Then, a final estimation of the wiring line capacitance $C_2$ is made from the following function (f):

$$C_2 = f(N, n)$$

where N denotes an equivalent gate number. This is based on the fact that the wiring line capacitance $C_2$ also varies in accordance with the scale of the logic units to be connected therewith, which scale is proportionally defined as the equivalent gate number N. The value of the function f(N, n) is expressed in units of "lu", i.e., "loading units." That is, the value of the function f(N, n) is normalized by the value of an input capacitance of a basic gate. In this case, the function f(N, n) is obtained by statistically treating data collected in the past. Further, the fan-out n is determined from the number M of the connections of the logic units to the wiring lines concerned minus one, i.e., $M-1$, where the "one" corresponds to the driver unit among the logic units concerned.

For example, referring to FIG. 1, the wiring lines L are connected with 18 logic units 1 through 18. Therefore, the number M of the connections is 18. Accordingly, the fan-out n, from the expression $M-1$, is 17. Further, as mentioned previously, the equivalent gate number is about 1500. Therefore, the estimated wiring line capacitance $C_2$ of the wiring lines L can be determined as $$C_2 = f(1500, 17).$$

The resultant capacitance $C_2$ will be explained in more detail below in terms of a propagation delay time t.

Figure 2:
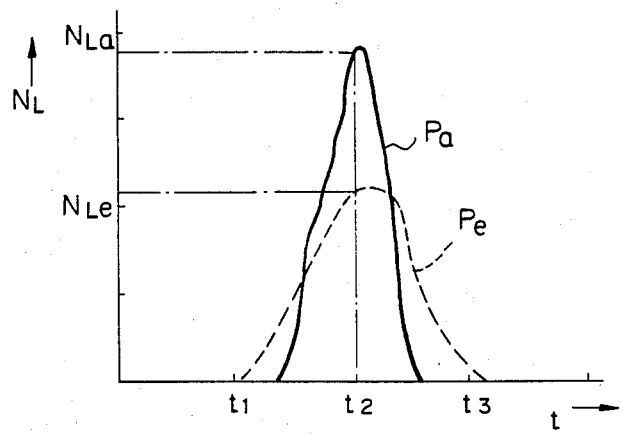
FIG. 2 is a histogram showing both data estimated according to the prior art and actual data.

FIG. 2 is a histogram showing both data estimated according to the prior art and actual data. The histogram was obtained for a certain arithmetic logic unit (ALU) having about 1000 delay path lines L. In the histogram, the broken line curve Pe represents the estimated data and the solid line curve Pa represents the actually measured data. It should be recognized that the wiring line capacitance can be expressed in terms of the propagation delay time of each gate and that it affects the total propagation delay time of the delay path. The delay time t is indicated as the abscissa of the histogram. The ordinate indicates the number $N_L$ of the delay paths L. The histogram shows, for example, an estimated $N_{Le}$ number of delay paths L having the propagation delay time $t_2$ compared with an actual number $N_{La}$ of the same delay time. The total number $N_L$ is about 1500. The propagation delay times $t_1$, $t_2$, and $t_3$ are on the order of 50 ns, 100 ns, and 150 ns, respectively.

As apparent from the histogram of FIG. 2, the estimated data Pe only roughly approximates the actual data Pa. Therefore, highly accurate estimates cannot be expected.

The method for estimating the wiring line capacitance of the present invention makes use of two parameters; levels of hierarchal functional blocks and fan-out.

Figure 3:
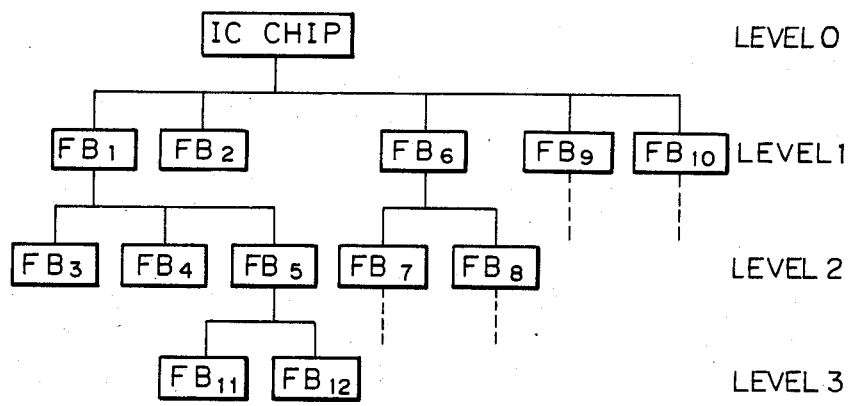
FIG. 3 is a block diagram representing hierarchal functional blocks on which the present invention is based.

FIG. 3 is a block diagram representing hierarchal functional blocks on which the present invention is based. The hierarchal functional blocks are taken into consideration particularly at the logic design stage of a logic IC. In FIG. 3, 12 functional blocks $FB_1$ through $FB_{12}$ are illustrated as an example. The functional blocks $FB_1$ through $FB_{12}$ can be divided into levels such as LEVEL 1, LEVEL 2, and LEVEL 3, as illustrated in FIG. 3. These levels specifically define the hierarchy. The level 0 corresponds to the single IC chip as a whole.

Although the concepts of functional blocks ($FB_1$ to $FB_{12}$) and levels are particularly pertinent at the logic design stage, they are still effective at the following layout stage.

Figure 4:
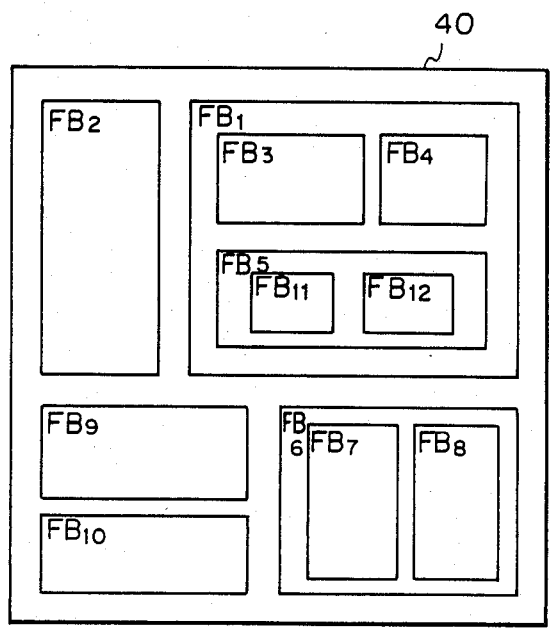
FIG. 4 is a plan view of an IC chip illustrating a layout of the hierarchal functional blocks.

FIG. 4 schematically illustrates a layout of the hierarchal functional blocks. As seen from FIG. 4, the hierarchy set up at the logic design stage is maintained at the layout design stage. That is, the functional blocks $FB_{11}$ and $FB_{12}$ of level 3 are accommodated in the functional block $FB_5$ of level 2, the functional block $FB_5$ is accommodated in the functional block $FB_1$ of level 1, and the functional block $FB_1$ is mounted on a single IC chip 40 of level 0. The above-mentioned use of hierarchal functional blocks is one of the important parameters in estimating the wiring line capacitance, as will be clarified hereinafter.

Figures 5A, 5B:
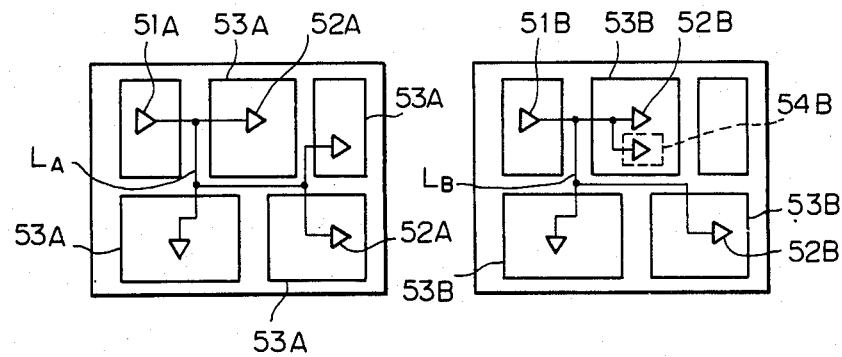
FIGS. 5A through 5D are block diagrams used for explaining the fan-out on which the present invention is based.
Figures 5C, 5D:
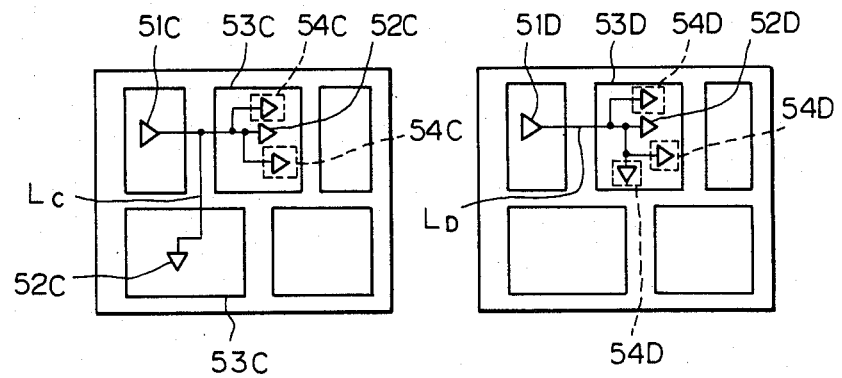

FIGS. 5A through 5D are block diagrams used for explaining fan-out. The concept of fan-out itself is also used in the prior art. The difference here is that the fan-out according to the present invention is particularly used in relation to the level of each functional block. In FIG. 5A, the delay path $L_A$ is specified as a closed network. Similarly, in FIGS. 5B through 5D, the delay paths $L_B$ through $L_D$ are specified as closed networks. Each closed network is connected to only one driving logic unit concerned, such as 51A through 51D, and terminated at respective receiving logic units concerned, such as 52A in FIG. 5A. Therefore, these receiving logic units are always supplied with the same logic data, simultaneously.

In FIG. 5A, when viewed from the driving logic unit 51A, there are four upper level functional blocks 53A and no lower level functional blocks. This is called "category A". In FIG. 5B, when viewed from the driving logic gate 51, there are three upper level functional blocks 53B and one lower level functional block 54B. This is called "category B." In FIG. 5C, when viewed from the driving logic gate 51C, there are two upper level functional blocks 53C and two lower level functional blocks 54C. This is called "category C." In FIG. 5D, when viewed from the driving logic gate 51D, there is one upper level functional block 53D and three lower level functional blocks 54D. This is called "category D." Thus, the following table I is obtained with respect to the fan-out (FO)

TABLE I

| Category | Upper level FO | Lower level FO |
|---|---|---|
| A | 4 | 0 |
| B | 3 | 1 |
| C | 2 | 2 |
| D | 1 | 3 |

It should be understood that, in FIGS. 5A through 5D, the layouts are illustrated, for simplicity, by the case where the lower functional block is set up as a single level only. In actuality, however, the lower level functional blocks may be divided into two or more levels, as in FIG. 4. Thus, the possible categories are not limited to the four categories A through D.

Figure 6:
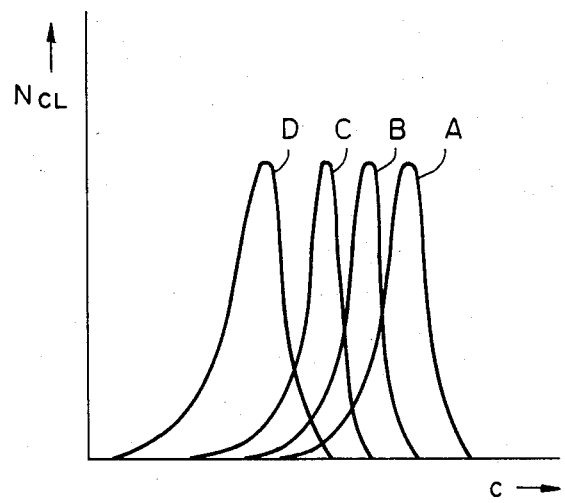
FIG. 6 is a graph exhibiting the relationship between the number of the closed networks and the propagation delay time.

The fan-out can be more precisely analyzed than in the prior art by taking the parameters of levels into account. FIG. 6 is a graph exhibiting the relationship between the number of closed networks $N_{CN}$ and the wiring line capacitance c. The four characteristic curves A through D are obtained through statistical treatment of actual data collected in the past. The curves A through D correspond to the categories A through D. According to the present invention, in the example of FIG. 6, there are four choices (A to D) for estimating the wiring line capacity of the closed network, so that more precise estimation is possible. It is considered that the prior art does not use the four curves A through D, but uses only one. In the graph of FIG. 6, the wiring line capacitance to be estimated is represented by the value at the peak of each of the normal distribution curves A through D. As a result, the estimated wiring line capacitances, according to the present invention, can approximate the actual wiring line capacitances more accurately, as will be later clarified with reference to FIG. 8.

Figure 7:
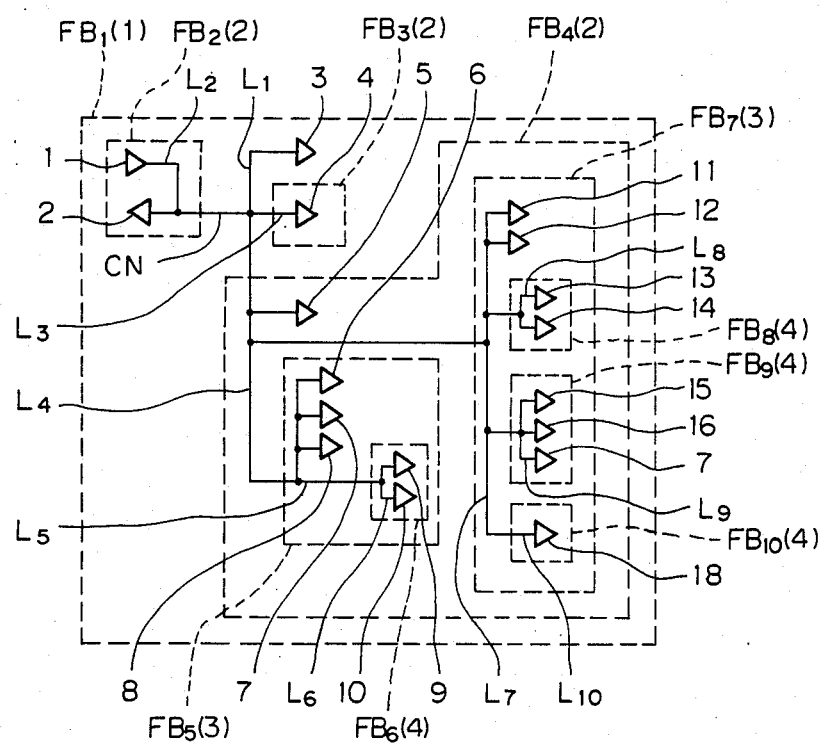
FIG. 7 is logic circuit diagram used for explaining an estimation method according to a first embodiment of the present invention.

FIG. 7 is a logic circuit diagram used for explaining an estimation method according to a first embodiment of the present invention. In FIG. 7, reference numerals 1 through 18 indicate logic units. The logic unit 1 works as a driving logic unit and the remaining units as receiving logic units, as in FIGS. 1 and 5A through 5D.

The steps for achieving the method of the present invention will be explained below. First, a functional block of an uppermost level of the closed network CN is determined. The closed network CN is composed of the delay paths $L_1$ through $L_{10}$. It should be noted that there are many closed networks CN on a single IC chip. An arbitrary one is illustrated in FIG. 7 for simplicity. The thus-determined functional block of the uppermost level, namely a main functional block, i.e., the functional block $FB_1$, is divided into hierarchal functional blocks of a lower level, namely subfunctional blocks, i.e., the functional blocks $FB_2$ through $FB_{10}$. Thus, the main functional block $FB_1$ contains therein the subfunctional blocks $FB_2$ through $FB_{10}$, while making mutual connections by way of the closed network.

When dividing the main functional block $FB_1$ into the subfunctional blocks $FB_2$ through $FB_{10}$, a simple rule must be kept that each subfunctional block must be provided with only one outside incoming wiring line, as shown in FIG. 7. Then, the level and the fan-out of each functional block are detected. The level (refer to LEVEL 0 through LEVEL 3 in FIG. 3) can be defined by, for example, the equivalent gate number $N_G$. The fan-out can be detected by, for example, counting both the number X of the subfunctional blocks of the next lower level relative to the one functional block concerned and the number Y of independent logic units.

In a logic IC, such as a microprocessor, the functional blocks of level 1 are, for example, a register file, an arithmetic logic unit (ALU), a decoder, an input/output (I/O) unit, and the like. The functional blocks of level 2 are, for example, for the arithmetic logic unit (ALU), an upper byte ALU and a lower byte ALU. Similarly, the functional blocks of level 3 are, for example, for the decoder, an instruction decoder and an address decoder. The functional blocks of level 3 are, for example, for the I/O unit, an input control unit and an output control unit. The functional blocks of level 4 are comprised of various fundamental elements, such as NOR gates, NAND gates, and flip-flops. These fundamental elements and the logic units are represented, in FIG. 7, by triangular-shaped symbols, as in FIG. 1.

In the above-mentioned steps, the closed network CN of FIG. 7 is specified by with many parameters, as shown in the following Table II.

TABLE II

| Functional block (FB) | Level ($N_G$) | Fan-out | |
|---|---|---|---|
| | | (X) | (Y) |
| Main $FB_1$ | 1500 (1) | 3 | 1 |
| Sub $FB_2$ | 300 (2) | 0 | 2 |
| Sub $FB_3$ | 500 (2) | 0 | 1 |
| Sub $FB_4$ | 650 (2) | 2 | 1 |
| Sub $FB_5$ | 250 (3) | 1 | 3 |
| Sub $FB_6$ | 150 (4) | 0 | 2 |
| Sub $FB_7$ | 350 (3) | 3 | 2 |
| Sub $FB_8$ | 100 (4) | 0 | 2 |
| Sub $FB_9$ | 150 (4) | 0 | 3 |
| Sub $FB_{10}$ | 50 (4) | 0 | 1 |

In Table II, the level of each functional block is specified by an equivalent gate number $N_G$, such as 1500, 300, 500 ... which are approximate numbers. The corresponding hierarchal level numbers such as 1, 2, 3, and 4, are shown in parentheses in each row. The fan-out of each functional block is expressed by both the aforesaid number X of the next lower level functional blocks and the number Y of the independent logic units. Taking the subfunctional block $FB_4$ as an example, the block $FB_4$ is set up with about 650 equivalent gates and is provided with two next lower level functional blocks $FB_5$ and $FB_7$ and one independent logic unit 5. The other functional blocks may be interpreted in the same way as the block $FB_4$.

The details recited above in Table II can all be obtained at the logic design stage with reference to a logic design chart of a prototype. The prototype is improved to provide a final design chart by taking the wiring line capacitances, i.e., the propagation delay times t, into account. To be specific, the estimated wiring line capacitances $C_{21}$ through $C_{210}$ of the wiring lines $L_1$ through $L_{10}$, respectively, are used to determine the final estimated wiring line capacitance $C_2$ for the closed network CN by counting the cumulative value of $C_{21}$ through $C_{210}$.

The detailed process to obtain the estimated wiring line capacitances $C_{21}$ through $C_{210}$ will be explained below. The main wiring line capacitance of the main delay path $L_1$ in the main functional block $FB_1$ is estimated as $C_{21}$ with the use of a main function ($f_1$). The remaining wiring line capacitances are estimated as incremental wiring line capacitances $C_{22}$ through $C_{210}$ with respect to the main wiring line capacitance $C_{21}$, which capacitances $C_{22}$ through $C_{210}$ are derived from the sub delay paths $L_2$ through $L_{10}$, with the use of subfunction ($f_2$). That is, the estimated main wiring line capacitance $C_{21}$ is expressed by the following:

$$C_{21} = f_1(N_G, X + Y - 1)$$
$$= f_1(N_G, n)$$

The characters $N_G$, X, Y, and n are already explained. It should be noted here that $$X + Y - 1 = n$$

stands. This is because, X+Y represents the number of all connections for one functional block and not the fan-out itself. The fan-out n can be obtained by subtracting one, i.e., one wiring line provided directly by this functional block itself, from X+Y.

Similarly, the estimated incremental wiring line capacitance $C_{22}$ is expressed by the following:

$$C_{22} = f_2(N_G, X + Y - 1)$$
$$= f_2(N_G, n)$$

The remaining sub wiring line capacitance $C_{23}$ through $C_{210}$ are also expressed by the above recited subfunction ($f_2$). The estimated main and incremental wiring line capacitances $C_{21}$ and $C_{22}$ through $C_{210}$ are expressed in terms of the unit lu, i.e., loading unit, mentioned previously.

The main function $f_1$ and the subfunction $f_2$ are specifically defined by data listed in Tables III and IV, respectively.

TABLE III

| Level | $N_G$ | Fan-out (n) | | | | |
|---|---|---|---|---|---|---|
| | | 1 | 2 | 3 | 4 | 5 |
| 4 | 1 to 200 | 1.5 | 1.8 | 2.2 | 2.6 | 3.0 |
| 3 | 201 to 400 | 2.3 | 2.9 | 3.4 | 4.0 | 4.6 |
| 2 | 401 to 1000 | 4.5 | 5.7 | 6.8 | 7.9 | 9.0 |
| 1 | 1001 or more | 9.7 | 12.2 | 14.8 | 17.3 | 19.8 |

TABLE IV

| Level | $N_G$ | Fan-out (n) | | | | |
|---|---|---|---|---|---|---|
| | | 1 | 2 | 3 | 4 | 5 |
| 4 | 1 to 200 | 0.5 | 1.1 | 1.6 | 2.1 | 2.5 |
| 3 | 201 to 400 | 0.8 | 1.6 | 2.4 | 3.2 | 3.9 |
| 2 | 401 to 1000 | 1.6 | 3.2 | 4.7 | 6.2 | 7.6 |

The data listed in Tables III and IV are predetermined through statistical treatment of actual data measured from many different typical logic IC's. Table III is used, instead of the main function $f_1$ ($N_G$, n), to calculate the estimated main wiring line capacitance $C_{21}$. Table IV is used, instead of the subfunction $f_2$ ($N_G$, n), to calculate the estimated incremental wiring line capacitances $C_{22}$ through $C_{210}$. The calculation is carried out in such a manner as clarified below, with the use of Tables III and IV. A fan-out n of more than 6 is also possible, but is not disclosed in these tables for simplicity.

First, the estimated main and sub wiring line capacitances $C_{21}$ and $C_{22}$ through $C_{210}$ are specified by using Tables III and IV, as clarified in the following Table V.

TABLE V

| Functional block (FB) | Level | Fan-out (n) | Table (Function) | Capacitance (in lu) |
|---|---|---|---|---|
| Main $FB_1$ | 1 | 3 | III ($f_1$) | $C_{21}$ = 14.8 |
| Sub $FB_2$ | 3 | 1 | IV ($f_2$) | $C_{22}$ = 0.8 |
| Sub $FB_3$ | 2 | 0 | IV ($f_2$) | $C_{23}$ = 0 |
| Sub $FB_4$ | 2 | 2 | IV ($f_2$) | $C_{24}$ = 3.2 |
| Sub $FB_5$ | 3 | 3 | IV ($f_2$) | $C_{25}$ = 2.4 |
| Sub $FB_6$ | 4 | 1 | IV ($f_2$) | $C_{26}$ = 0.5 |
| Sub $FB_7$ | 3 | 4 | IV ($f_2$) | $C_{27}$ = 3.2 |
| Sub $FB_8$ | 4 | 1 | IV ($f_2$) | $C_{28}$ = 0.5 |
| Sub $FB_9$ | 4 | 2 | IV ($f_2$) | $C_{29}$ = 1.1 |
| Sub $FB_{10}$ | 4 | 0 | IV ($f_2$) | $C_{210}$ = 0 |

Regarding the main functional block $FB_1$, the main wiring line capacitance $C_{21}$ of the main wiring line $L_1$ is estimated to be 14.8 lu. In this case, Table III is referred to. The related capacitance $C_{21}$ is specified at the point where the row of level 1 and column of fan-out 3 intersect. Regarding the subfunctional block $FB_2$, the incremental wiring line capacitance $C_{22}$ of the sub delay path $L_2$ is estimated to be 0.8 lu. In this case, reference is made to Table IV. The related capacitance $C_{22}$ is specified at the point where the row of level 3 and column of fan-out 1 intersect. When the fan-out is 0, the corresponding wiring capacitance is necessarily 0, as in the blocks $FB_3$ and $FB_{10}$. Similarly, regarding the subfunctional block $FB_4$, the incremental wiring line capacitance $C_{24}$ of the sub delay path $L_4$ is estimated to be 3.2 lu. In this case, reference is made to Table IV. The related capacitance $C_{24}$ is specified at the point where the row of level 2 and column of fan-out 2 intersect. Similarly, the related capacitance of the remaining functional blocks $FB_5$ through $FB_9$ can be determined with reference to Table IV.

Next, the total wiring line capacitance $C_2$ of the closed network CN is obtained by counting the cumulative value of all the estimated wiring line capacitances, i.e.

$$C_2 = \sum_{k=1}^{10} C_{2k}.$$

As a result, the capacitance to be estimated becomes $C_2 = 26.5 = (14.8 + 0.8 + \ldots + 1.1)$ lu.

Figure 8:
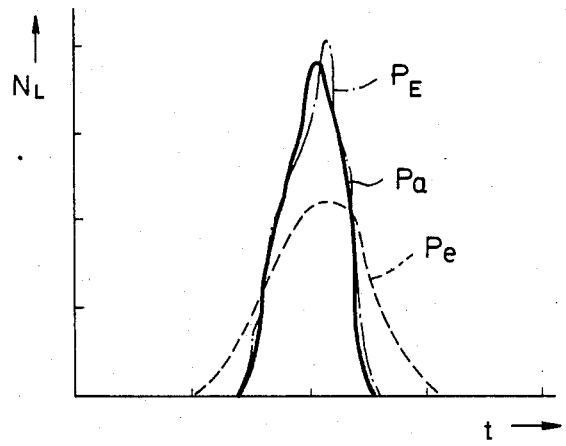
FIG. 8 is a histogram showing data estimated according to the present invention and according to the prior art, and actual data.

FIG. 8 is a histogram showing data estimated according to the present invention and the prior art, and actual data. The histogram may be interpreted in the same way as that of FIG. 2. The conditions for obtaining the histogram are the same as those of FIG. 2. Therefore, the estimated curve Pe of the prior art and the actually measured curve Pa are the same as those shown in FIG. 2. The chain-dotted line curve $P_E$ indicates the data estimated in accordance with the present invention. As will be understood from this histogram, the estimated curve $P_E$ can approximate the actually measured curve Pa with considerably higher accuracy than that of the prior art curve Pe. It is also apparent that the method according to the present invention enables good estimation of not only the logic IC generally, but also detailed parts thereof. The method of the prior art enables good estimation, though worse than the present invention, for a logic IC generally but a poor one for detailed parts thereof, as recognized from the curve Pe.

Figure 9A:
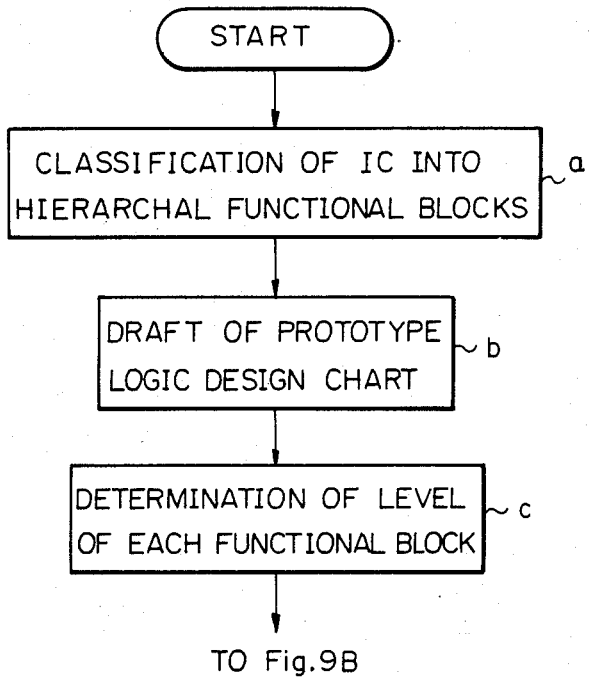
FIGS. 9A, 9B, and 9C are flow charts of an example of successive processing steps for a method according to the present invention.
Figure 9B:
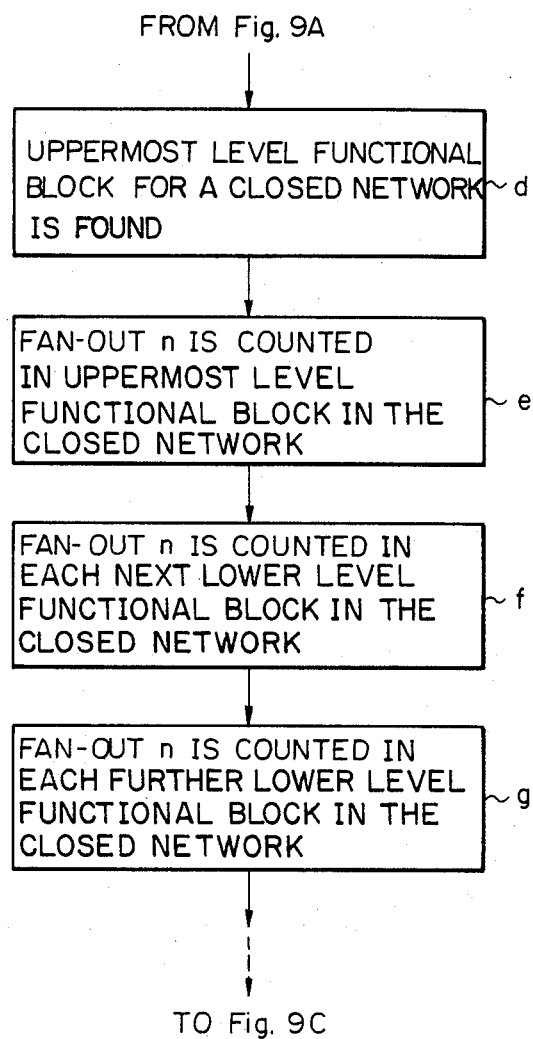
Figure 9C:
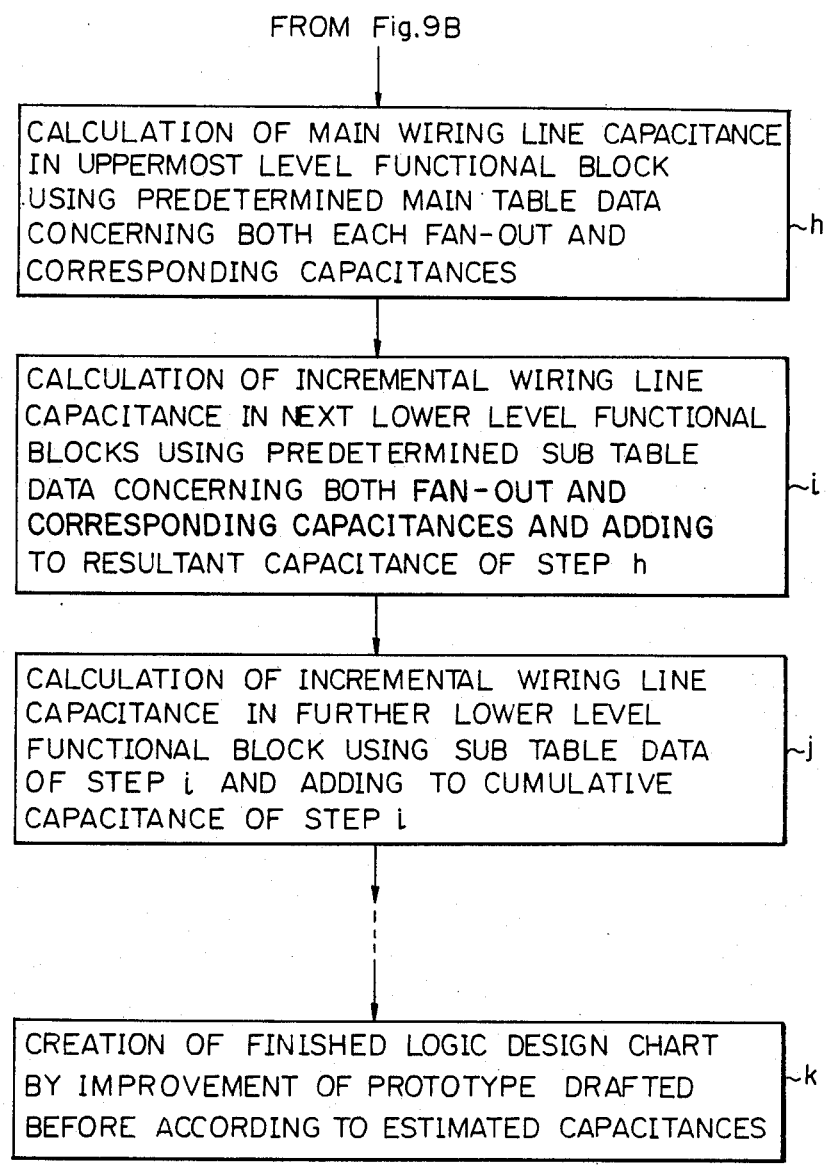

FIGS. 9A, 9B, and 9C are flow charts of an example of processing steps for the method according to the present invention. In FIG. 9A, at step a, a logic IC is classified into two or more hierarchal functional blocks to conform with user requirements.

At step b, a prototype logic design chart is drafted with the use of the thus classified functional blocks.

At step c, with reference to the thus drafted prototype logic design chart, the level of each functional block is determined. The level, such as 1, 2, 3, or 4, is preferably determined as the equivalent gate number $N_G$ to be accommodated in each functional block, as shown in Tables III and IV.

During the steps in FIG. 9B, the fan-out n is obtained for each closed network CN. In FIG. 9B, at step d, the uppermost level functional block, i.e., the main functional block such as $FB_1$, is found, in which a closed network is entirely enclosed.

At step e, the fan-out n is counted for the closed network contained in the thus uppermost level functional block. As recognized previously, the fan-out n is equal to the number of the next lower level functional blocks plus the independent logic units, if any (same for later similar steps).

At step f, the fan-out n is counted for the closed network contained in each next lower level functional block (refer to $FB_2$, $FB_3$, and $FB_4$) relative to the uppermost level functional block.

At step g, the fan-out n is counted for the closed network contained in each further lower level functional block (refer to $FB_5$ and $FB_7$) relative to each of the next lower level functional blocks, for example $FB_4$. An identical step or steps follow after step g so long as at least one further lower level functional block exists.

During the steps in FIG. 9C, the wiring line capacitances are calculated for each closed network based on the resultant fan-out n obtained through the above steps d through g. In FIG. 9C, at step h, a calculation is made of the main wiring line capacitance of the delay paths composing the closed network CN contained in the uppermost level functional block, such as $FB_1$, but excluding the delay paths wholly contained in the lower level functional blocks, in accordance with predetermined data regarding the relationship between each fan-out n and the corresponding wiring line capacitance. The relationship is defined, in the first embodiment, by a table for the main functional block, such as Table III.

At step i, calculation is made of the incremental wiring line capacitance of the sub delay paths in each of the next lower level functional blocks composing the closed network CN in the next lower level functional blocks, if any, such as $FB_2$, $FB_3$ and $FB_4$, but excluding those contained in the further lower level functional block or blocks, if any, such as $FB_5$, $FB_6$, $FB_7$, $FB_8$, $FB_9$, and $FB_{10}$, in accordance with the predetermined sub table data concerning the relationship between each fan-out n and the corresponding wiring line capacitances. The relationship is defined, in the first embodiment, by a table for the subfunctional blocks, such as Table IV. The thus calculated incremental wiring line capacitance is added to the main wiring line capacitance obtained in the preceding step h.

At step j, calculation is made of the further incremental wiring line capacitance of the sub delay paths composing the closed network CN in each of the further lower level functional blocks, if any, such as $FB_5$ and $FB_7$, but not contained in the still further lower level functional blocks, if any, such as $FB_8$, $FB_9$, and $FB_{10}$, in accordance with the aforesaid predetermined sub table data. The thus calculated incremental wiring line capacitances are added to the cumulative wiring line capacitance obtained in the preceding step i.

A step or steps identical to step j follow until the lowermost level functional blocks are reached. After this, the estimated wiring line capacitance of the closed network concerned is obtained as the cumulative value of the main and incremental wiring line capacitances.

The above recited steps d through j are repeatedly applied to every closed network to obtain estimated wiring line capacitances of respective closed networks. Incidentally, the aforesaid step c in FIG. 9A can be omitted, if necessary, and replaced with a step in which the level of each functional block is predetermined at the same time when step a is performed.

After step j has been completed for every closed network, a finished logic design chart is created as an improvement of the prototype logic design chart drafted in step b of FIG. 9A by using the estimated wiring line capacitances of respective closed networks. This is done in step k of FIG. 9C.

The thus created finished logic design chart is used thereafter to achieve the layout design of the user's logic IC. At this layout design stage, the designer simply allocates the main functional and subfunctional blocks on the single IC chip in accordance with the finished logic design chart. In this case, no reevaluation of the logic design, in response to the actual layout performance, would be needed. This is because, as mentioned above, the deviations in the wiring line capacitances at the logic design stage from that at the layout design stage can be precisely estimated in advance before the layout design stage and fed back to the logic design.

In the manner described above, the wiring line capacitances can be estimated. When it is confirmed that the thus estimated value is equal to the design value, then layout design is started in which various block allocations are determined. Although, during the logic design stage, the blocks are hierarchally allocated sequentially at designated individual positions under the so-called top-down mode, during the layout design stage, the blocks are sequentially allocated inversely under the so-called bottom-up mode. That is, the lower level block is allocated first and then the upper level block is allocated thereon, which allocation is performed repeatedly to reach the uppermost block or blocks to form the overall block layout. The layout of logic circuits on the chip is actually performed in accordance with the thus determined layout design.

A method according to a second embodiment of the present invention will be described below. In the first embodiment, the relationship between each fan-out and the corresponding wiring line capacitances is predetermined in the form of both the main table data (Table III) and the sub table data (Table IV). In the second embodiment, however, the estimated wiring line capacitance is not obtained from a sub table data, but from the main table data. To be specific, the table data for the subfunctional blocks is obtained through a particular compensating computation with the use of a variety of compensation factors $\alpha$ ($0 < \alpha < 1$). The factor $\alpha$ varies according to the level at which each further lower level functional block is positioned. Taking, in Table III, the entry for functional block $FB_4$, i.e., level 2 and fan-out 2, as an example, the related uppermost level functional block has a wiring line capacity 5.7 lu. If this functional block is provided with a fan-out greater by 2, i.e., a fan-out of 4, the wiring line capacitance would be determined as 7.9 lu. However, in the example, the functional block FB$_4$ is not provided with a higher fan-out, but two more lower level functional blocks, FB$_5$ and FB$_7$. In this case, the incremental wiring line capacitance due to these lower level functional blocks is taken, if the first embodiment is employed, from Table IV. However, in the second embodiment, no such Table IV exists. This being so, in the second embodiment, the incremental wiring line capacitance can be estimated by the expression $\alpha$ (7.9–5.7). The compensation factor $\alpha$ is, for example, 0.5. Thus, the incremental wiring line capacitance due to the lower level functional blocks can be calculated by using the main table data only, while no sub table data, such as Table IV, is used. The value of the compensation factor $\alpha$ is not constant, but variable in accordance with the level at which each lower level functional block is positioned. Generally, the lower the level, the smaller the values of the factor $\alpha$.

Anyway, as understood from the above, the table data is important in the present invention as the predetermined data concerning the average wiring line capacitance. Referring again to Table III, the average wiring line capacitance is fixedly allotted to both the levels of the corresponding fan-outs. For example, at level 3 and fan-out 3, the average wiring line capacitance is fixedly given as 3.4 to any equivalent gate number $N_G$ in the range of 201 through 400. However, in actuality, the average wiring line capacitances for $N_G=201$ and $N_G=400$ cannot be exactly the same, while the capacitance may be correct for the center $N_G$ of 300 and thereabout. In this regard, there is some room for improving the accuracy of the average wiring capacitances. According to the above-mentioned example, the value of the capacitance at $N_G=201$ should be smaller than 3.4, while the value at $N_G=400$ should be larger than 3.4. Thus, the capacitance is preferably expressed as $k \times 3.4$, where k is a variable coefficient, and $k=1$ strictly stands when $N_G=300$. The variable coefficient is determined by, for example, $$k = \sqrt{\frac{N_G}{300}},$$

in this case. This is based on the fact that the length of each delay path varies in proportion to the area in terms of, for example, mm$^2$ in which the wiring lines are accommodated. In other words, conversely, if the lengths of the delay paths in one direction and a direction perpendicular thereto are extended twice, the related area on the chip may be enlarged about four times. Due to this fact, the variable coefficient k should be varied according to the square root of the ratio of the equivalent gate number $N_G$ relative to the reference or center equivalent gate number $N_G$, i.e., 300 in the above example. This also applies to levels other than the above-explained level 3 of Table III.

As explained above in detail, according to the present invention, highly accurate estimation can be realized, which does not require reevaluation of the logic design after a trial layout design, as required the prior art. This makes it possible to shorten the time for manufacturing IC's, especially custom logic IC's.

We claim:

1. A method for constructing an integrated circuit including designing the integrated circuit with consideration of a propagation delay time of each wiring line capacitance on a single integrated circuit chip, said method comprising the steps of:
   (i) classifying logic units and logic gates of the integrated circuit into hierarchal functional blocks;
   (ii) specifying an uppermost level functional block for a closed network and further specifying lower level functional blocks contained in the uppermost level functional block and inter-connected by the closed network;
   (iii) calculating estimates for wiring line capacitances in each of the functional blocks in accordance with predetermined data concerning average wiring line capacitances for every level;
   (iv) estimating a network wiring line capacitance of the closed network by summing the estimates for the wiring line capacitances; and
   (v) allocating the hierarchal functional blocks on the integrated circuit chip to form the integrated circuit, said allocating starting with the lowest level functional blocks and progressing sequentially to the uppermost level functional block.

2. A method as set forth in claim 1, wherein, said classifying in step (i) is performed with a restriction that each of the uppermost and lower level functional blocks is provided with a single incoming delay path.

3. A method as set forth in claim 2, wherein the predetermined data in step (iii) is defined by level and fan-out of internal wiring lines existing in an average functional block.

4. A method as set forth in claim 3, wherein the level is determined by an equivalent gate number.

5. A method as set forth in claim 4, wherein the fan-out is determined by an expression $X+Y-1$, where X represents a number of lower level functional blocks within the average functional block, and Y represents a number of independent logic units contained in the average functional block.

6. A method as set forth in claim 5, wherein the predetermined data are provided in the form of a main table for the uppermost level functional block and a sub table for the lower level functional blocks, the main and sub tables prepared through statistical treatment of actual data measured from many different usual integrated circuits of a type similar to the integrated circuit to be designed.

7. A method as set forth in claim 6, wherein each of the main and sub tables has a plurality of rows and columns representing levels and fan-out, respectively.

8. A method as set forth in claim 7, wherein step (iii) comprises obtaining desired data from the main and sub tables, at a cross point of one of the rows and one of the columns for the level and the fan-out which are specified.

9. A method as set forth in claim 7,
   wherein step (iii) comprises obtaining each of the estimates for the wiring line capacitances from a corresponding cross-point in one of the main and sub tables, and
   wherein step (iv) comprises summing the estimates for the wiring line capacitances to determine the wiring line capacitances of the closed network.

10. A method as set forth in claim 5,
    wherein the predetermined data are provided in the form of a main table for the uppermost level functional block, while data corresponding to the lower level functional blocks are obtained by use of a compensation factor greater than zero and less than one, wherein step (iii) comprises the steps of:
(iiiA) obtaining a main wiring line capacitance for the uppermost level functional block using the main table; and
(iiiB) multiplying the compensation factor times a differental fan-out to produce an incremental wiring line capacitance due to the lower level functional blocks, where the differential fan-out is determined by a difference between the fan-out corresponding to the uppermost level functional block and a fan-out value increased by a number of lower level functional blocks in the uppermost level functional block, and
wherein step (iv) comprises adding the incremental wiring line to the main wiring line capacitance.

11. A method as set forth in claim 6, wherein step (iii) comprises modifying the predetermined data obtained for the average functional block by using a variable coefficient k, the coefficient k varying in proportion to the equivalent gate number, whereby each wiring line capacitance c for a corresponding functional block is determined by the equation:

$$c = k \times \bar{c}$$

where $$k = \sqrt{\frac{N_G}{\overline{N_G}}},$$

$\overline{N_G}$ denotes a value of a center number, corresponding to the average functional block, in a range of equivalent gate numbers which include the equivalent gate number $N_G$ specifying the level of the corresponding functional block, and c denotes the wiring line capacitance corresponding to the average functional block.

12. A method as set forth in claim 10, wherein step (iii) comprises modifying the predetermined data obtained for the average functional block by using a variable coefficient k, the coefficient k varying in proportion to the equivalent gate number, whereby each wiring line capacitance c for a corresponding functional block is determined by the equation:

$$c = k \times \bar{c}$$

where $$k = \sqrt{\frac{N_G}{\overline{N_G}}},$$

$\overline{N_G}$ denotes a value of a center number, corresponding to the average functional block, in a range of equivalent gate numbers which include the equivalent gate number $N_G$ specifying the level of the corresponding functional block, and $\bar{c}$ denotes the wiring line capacitance corresponding to the average functional block.

* * * * *

UNITED STATES PATENT AND TRADEMARK OFFICE
CERTIFICATE OF CORRECTION

PATENT NO. : 4,823,278

DATED : April 18, 1989

INVENTOR(S) : Kikuchi et al.

It is certified that error appears in the above-identified patent and that said Letters Patent is hereby corrected as shown below:

FRONT PAGE [73] "Osaki" should be --Kawasaki--.

Col. 6, line 19, delete "with".

Col. 9, line 66, "as $FB_8$," should be "as $FB_6$, $FB_8$,--.

Signed and Sealed this

Second Day of January, 1990

Attest:

JEFFREY M. SAMUELS

Attesting Officer     Acting Commissioner of Patents and Trademarks